(12) United States Patent
Kim et al.

(10) Patent No.: US 7,518,175 B2
(45) Date of Patent: Apr. 14, 2009

(54) SEMICONDUCTOR MEMORY DEVICE AND METHOD FOR FABRICATING THE SAME

(75) Inventors: Seung-Bum Kim, Ichon-shi (KR); Dong-sauk Kim, Ichon-shi (KR); Jung-Taik Cheong, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/673,344

(22) Filed: Feb. 9, 2007

(65) Prior Publication Data

US 2007/0128805 A1 Jun. 7, 2007

Related U.S. Application Data

(62) Division of application No. 11/004,420, filed on Dec. 3, 2004, now Pat. No. 7,192,825.

(30) Foreign Application Priority Data

Jun. 30, 2004 (KR) ............................... 2004-50199

(51) Int. Cl.
*H01L 27/108* (2006.01)
(52) U.S. Cl. ............... 257/304; 257/311; 257/E21.653; 257/E21.658
(58) Field of Classification Search ................. 257/304, 257/311, 382, E21.431, 213, 288, 296, 301, 257/E21.653, E21.658
See application file for complete search history.

(56) References Cited

U.S. PATENT DOCUMENTS

| | | | |
|---|---|---|---|
| 5,429,978 | A | 7/1995 | Lu et al. |
| 5,994,227 | A | 11/1999 | Matsuo et al. |
| 6,396,121 | B1 * | 5/2002 | Bertin et al. ................. 257/530 |
| 6,461,977 | B1 * | 10/2002 | Matsuo et al. ............... 438/740 |
| 7,192,825 | B2 | 3/2007 | Kim et al. |
| 2005/0040490 | A1 | 2/2005 | Park |

* cited by examiner

*Primary Examiner*—Brook Kebede
(74) *Attorney, Agent, or Firm*—Townsend and Townsend and Crew LLP (57) ABSTRACT

The present invention relates to a semiconductor memory device and a method for fabricating the same. The semiconductor memory device, including: a plurality of gate structures formed on a substrate; a contact junction region formed beneath the substrate disposed in lateral sides of the respective gate structures; a trench formed by etching a portion of the substrate disposed in the contact junction region with a predetermined thickness; a dopant diffusion barrier layer formed on sidewalls of the trench; and a contact plug filled into a space created between the gate structures and inside of the trench, wherein the dopant diffusion barrier layer prevents dopants within the contact plug from diffusing out.

16 Claims, 9 Drawing Sheets

SEMICONDUCTOR MEMORY DEVICE AND METHOD FOR FABRICATING THE SAME

FIELD OF THE INVENTION

The present invention relates to a semiconductor memory device and a method for fabricating the same; and, more particularly, to a semiconductor device with an improved refresh characteristic and a method for fabricating the same.

DESCRIPTION OF RELATED ARTS

A semiconductor memory device such as a dynamic random access memory (DRAM) device is composed of unit cells each including one transistor and one capacitor. The capacitor is contacted to one of junction regions, i.e., a source or a drain of a transistor in a cell region.

In order to obtain a storage node contact of the capacitor, one approach is to form a plug precedently into a fine contact hole having a high aspect ratio. This precedent plug formation solves a problem of a contact failure caused by a current trend in micronization and large-scale of integration. Also, the current trend in micronization and large-scale of integration has led to a development of a contact formation technique that allows a bit line and a storage node contact plug to be formed simultaneously.

Figure 1:
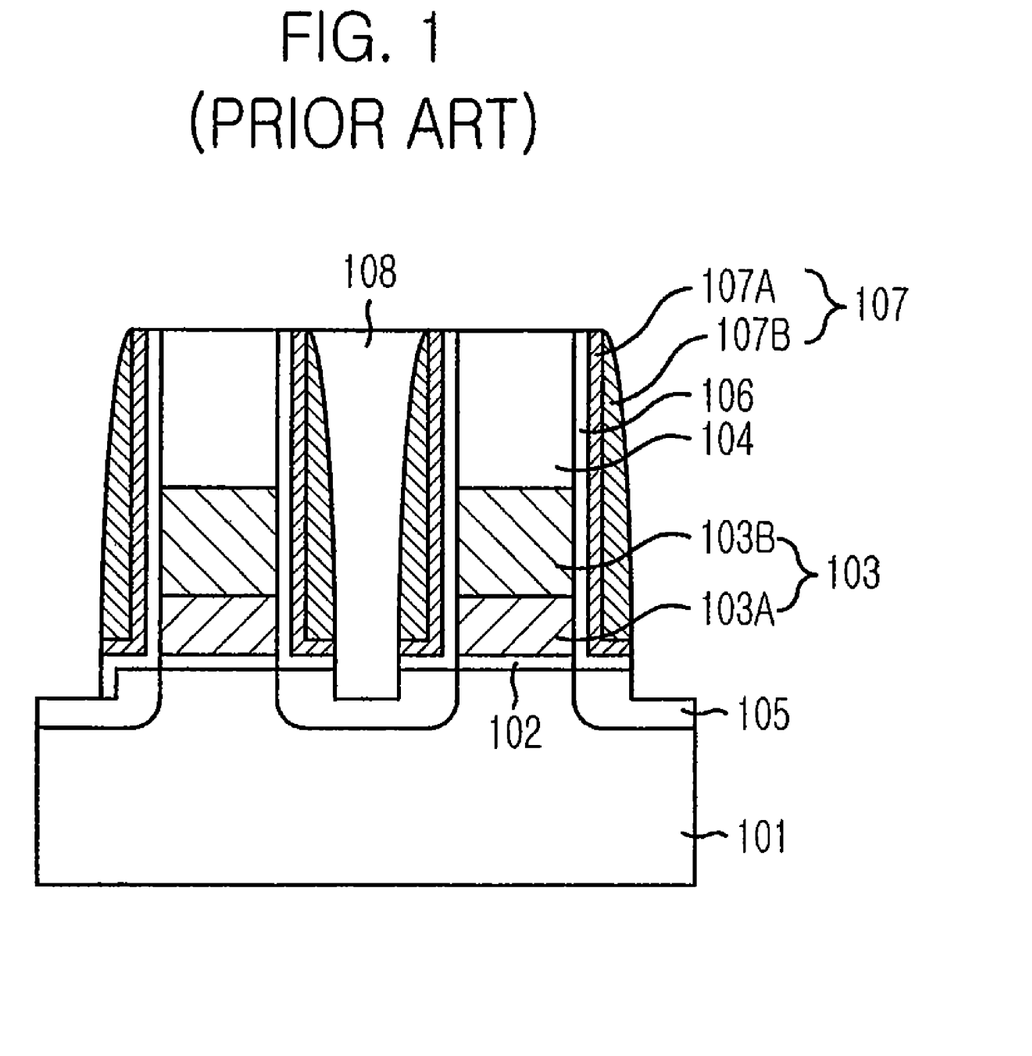
FIG. 1 is a cross-sectional view showing a storage node contact plug in a cell transistor region of a conventional semiconductor memory device.

FIG. 1 shows a cross-sectional view of a storage node contact plug in a cell transistor region of a conventional semiconductor memory device.

As shown, a gate oxide layer 102, a gate conductive structure 103 and a nitride layer 104 for use in a mask are sequentially formed on a silicon substrate 101. Herein, the gate conductive structure includes a polysilicon layer 103A and a tungsten silicide layer 103B. These sequentially stacked layers are then etched by using a gate mask, thereby obtaining a plurality of gate structures.

Next, a gate light oxidation process is carried out for the purpose of recovering damages generated from the above etching process and improving characteristics of the gate oxide layer 102. Afterwards, an ion implantation process is performed to form source/drain junctions 105, and a buffer oxide layer 106 is formed on the above resulting substrate structure.

Subsequent to the formation of the buffer oxide layer 106, a first nitride layer 107A and a second nitride layer 107B both for forming a spacer are deposited on the buffer oxide layer 106, and an anisotropic etching process is performed to the second nitride layer 107B, thereby forming a nitride-based spacer 107 on each sidewall of the gate structures. Especially, in the course of forming the nitride-based spacer 107, an over-etching process is additionally performed to the second nitride layer 107B in order for the oxides and nitrides, i.e., the buffer oxide layer 106 and the first and the second nitride layers 107A and 107B, not to remain on the silicon substrate 101 disposed in the source/drain junctions 105, and as a result, a predetermined thickness of the silicon substrate 101 disposed in the source/drain junctions 105 is etched away.

After the formation of the nitride-based spacer 107 on the gate structures, a contact plug 108 is formed. In more detail of forming the contact plug 108, a conductive layer such as a doped polysilicon layer or an epitaxial silicon layer is filled into a space created between the gate structures and by the over-etching process. Then, the conductive layer is subjected to a polishing process or an etch-back process. Herein, the contact plug 108 is particularly a storage node contact plug.

In the conventional semiconductor memory device fabricated as above, dopants existing within the storage node contact plug 108 are easily diffused out to the source/drain junctions 105. Therefore, the source/drain junctions 105 and channel regions of transistors are more closely neighbored with each other, resulting in generation of leakage currents caused by a highly concentrated electric potential at a PN junction.

As the junction leakage currents increase at a storage node contact junction region, i.e., the source/drain junction region, the data retention time becomes shorter, and this shorter data retention time becomes a factor for degrading a refresh characteristic of a semiconductor device such as a DRAM device.

Figure 2:
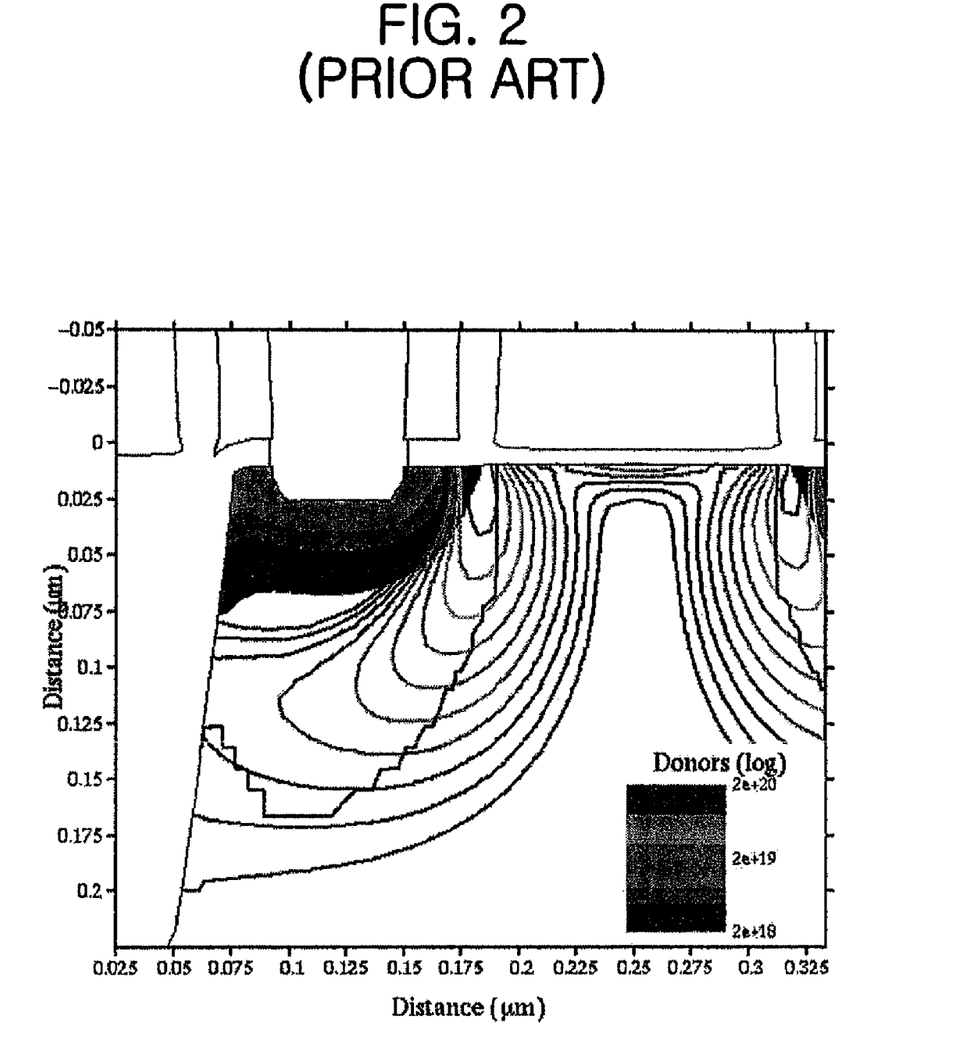
FIG. 2 shows a depth profile simulation result on a doping concentration in the semiconductor memory device shown in FIG. 1.

FIG. 2 shows a depth profile simulation result on a dopant concentration in the semiconductor memory device shown in FIG. 1.

As shown, the doping concentration of the dopant which is an N-type donor does not change in a gradual manner. Hence, as described above, the electric potential becomes much highly concentrated in a certain region, e.g., the PN junction, resulting in an increase in leakage currents.

Meanwhile, it has been contrived to increase a thickness of the nitride-based spacer 107 in order to solve the problem of the highly concentrated electric potential at the PN junction. However, there may still be a problem in this approach. That is, a contact size becomes smaller as the thickness of the nitride-based spacer 107 increases within a finely defined area because of a trend in micronization in the design rule which has led a distance between the gate structures to become narrower. Accordingly, it may not be possible to bury a sufficient amount of a plug material into a fine contact hole. That is, there may be a problem in generation of voids.

SUMMARY OF THE INVENTION

It is, therefore, an object of the present invention to provide a semiconductor memory device capable of solving a problem of a degraded refresh characteristic caused by out-diffused dopants of a storage node contact plug and a method for fabricating the same.

It is another object of the present invention to provide a method for fabricating a semiconductor memory device, wherein spacers are formed on sidewalls of gate structures with a relatively thick thickness even if a space between the gate structures is narrowed.

In accordance with an aspect of the present invention, there is provided a semiconductor memory device, including: a plurality of gate structures formed on a substrate; a contact junction region formed beneath the substrate disposed in lateral sides of the respective gate structures; a trench formed by etching a portion of the substrate disposed in the contact junction region with a predetermined thickness; a dopant diffusion barrier layer formed on sidewalls of the trench; and a contact plug filled into a space created between the gate structures and inside of the trench, wherein the dopant diffusion layer prevents dopants within the contact plug from diffusing out.

In accordance with another aspect of the present invention, there is provided a semiconductor memory device, including: a plurality of gate structures formed on a substrate; a contact junction region formed beneath the substrate disposed in lateral sides of the respective gate structures; an insulating spacer formed on sidewalls of the gate structures; a first trench formed by etching a first portion of the substrate disposed in the contact junction region and exposed by the insulating spacer with a predetermined thickness; a dopant diffusion barrier layer formed on sidewalls of the insulating spacer and sidewalls of the first trench; a second trench formed by etching a second portion of the substrate disposed in the contact junction region and exposed by the dopant diffusion barrier layer; and a contact plug filled into a space created between the gate structures and inside of the first trench and the second trench, wherein the dopant diffusion barrier layer prevents dopants within the contact plug from diffusing out.

In accordance with still another aspect of the present invention, there is provided a method for fabricating a semiconductor memory device, including the steps of: forming a plurality of gate structures on a substrate; forming a storage node contact junction region beneath the substrate disposed in lateral sides of the respective gate structures; forming a trench by etching a portion of the substrate disposed in the storage node contact junction region with a predetermined thickness; forming a dopant diffusion barrier layer on sidewalls of the trench; and forming a contact plug within a space created between the gate structures and inside of the trench, wherein the dopant diffusion barrier layer prevents dopants within the contact plug from diffusing out.

In accordance with further aspect of the present invention, there is provided a method for fabricating a semiconductor memory device, including the steps of: forming a plurality of gate structures on a substrate; forming a storage node contact junction region beneath the substrate disposed in lateral sides of the respective gate structures; forming an insulating spacer on sidewalls of the gate structures; etching a first portion of the substrate disposed in the storage node contact junction region and exposed by the insulating spacer with a predetermined thickness, thereby obtaining a first trench; forming a dopant diffusion barrier layer on sidewalls of the insulating spacer and sidewalls of the first trench; etching a second portion of the substrate disposed in the storage node contact junction region and exposed by the dopant diffusion barrier layer, thereby obtaining a second trench; and forming a contact plug within a space created between the gate structures and inside of the first trench and the second trench, wherein the dopant diffusion barrier layer prevents dopants within the contact plug from diffusing out.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A memory device and a method for fabricating the same in accordance with a preferred embodiment of the present invention will be described in detail with reference to the accompanying drawings, which is set forth hereinafter.

Figure 3:
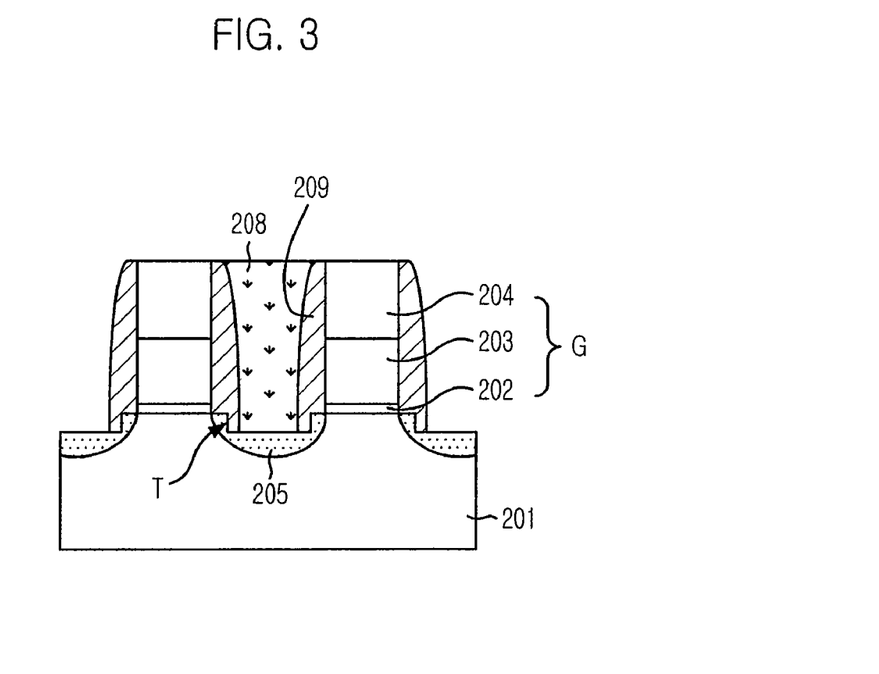
FIG. 3 is a cross-sectional view showing a characteristic structure of a semiconductor memory device fabricated in accordance with the present invention.

FIG. 3 is a cross-sectional view showing a characteristic structure of a semiconductor memory device fabricated in accordance with the present invention.

As shown, a gate oxide layer 202, a gate conductive layer 203 and an insulation layer for use in a mask 204 are sequentially formed on a substrate 201 and are then etched, thereby obtaining a plurality of gate structures G. A plurality of junction regions 205 are formed beneath predetermined portions of the substrate 201 disposed in lateral sides of the respective gate structures G. Herein, the junction region 205 that is contacted to a storage node contact plug which will be subsequently formed is called a storage node contact junction region.

A portion of the substrate 201 disposed in the storage node contact 205 is etched to form a shallow trench T. A depth of the trench T is shallower than that of the storage node contact junction region 205.

More importantly, a dopant diffusion barrier layer 209 is formed on sidewalls of the trench T. The dopant diffusion barrier layer 209 can be made of a conductive material or an insulation layer having a function of preventing dopant diffusion. However, for the simplification of the process, it is preferable to form the dopant diffusion barrier layer 209 on the sidewalls of the trench as well as on each sidewall of the corresponding gate structures G. At this time, the dopant diffusion barrier layer 209 is preferably made of an insulation material for the purpose of insulating the gate conductive layer 203 against a contact plug 208. Especially, since an inter-layer insulation layer for insulating the gate structures G against bit lines is mainly made of oxide, it is preferable to use nitride having a different etch selectivity from this oxide.

The above mentioned contact plug 208, which is a storage node contact plug, is formed inside of the trench T and between the gate structures G.

As described above, in the semiconductor memory device in accordance with the present invention, the trench T is formed in the predetermined portion of the substrate 201 disposed in the storage node contact junction region 205, and the dopant diffusion barrier layer 209 is formed on the sidewalls of the trench T. Particularly, the dopant diffusion barrier layer 209 serves a role in preventing dopants of the contact plug 208, which is a doped polysilicon layer, from diffusing towards the storage node contact junction region 205 adjacently located in a channel region of a transistor. That is, it is possible to prevent an electric potential from being concentrated at a certain region due to the fact that the storage node contact 205 becomes closely neighbored with the channel region of the transistor. Therefore, it is further possible to suppress an occurrence of junction leakage current, thereby preventing a refresh characteristic from being degraded.

Figure 4:
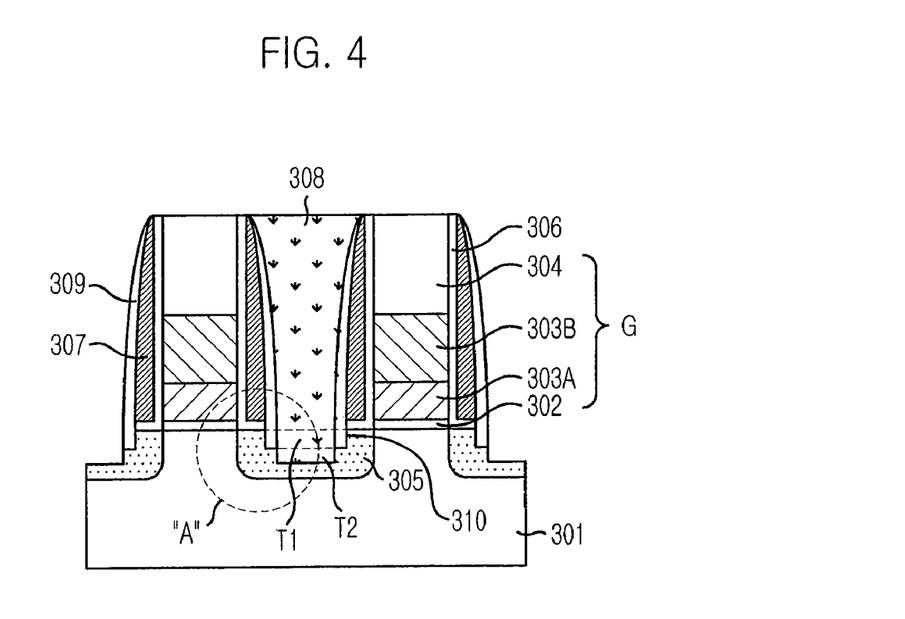
FIG. 4 is a cross-sectional view showing a storage node contact plug in a cell transistor region of a semiconductor memory device in accordance with a preferred embodiment of the present invention.
Figure 5A:
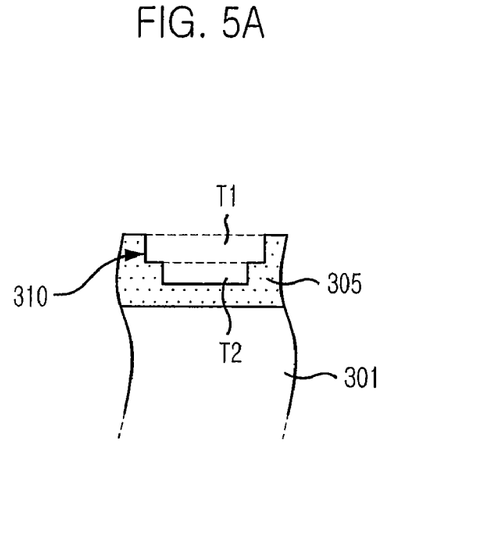
FIG. 5A is a diagram showing only a trench structure formed in accordance with the preferred embodiment of the present invention.
Figure 5B:
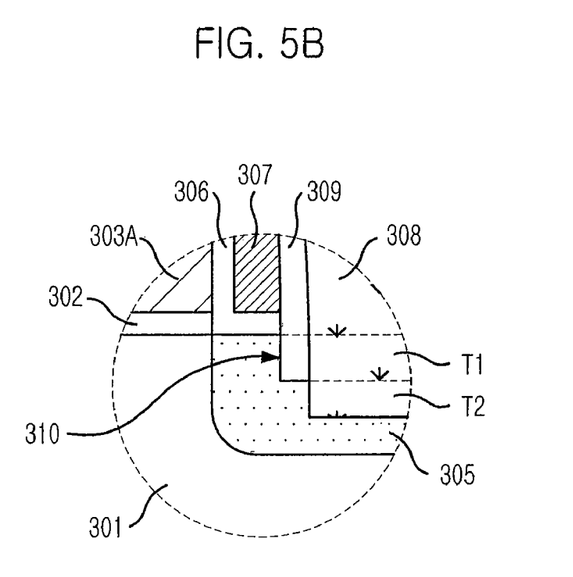
FIG. 5B is an enlarged diagram of a marked region of 'A' shown in FIG. 4.

FIG. 4 is a cross-sectional view showing a storage node contact plug in a cell transistor region of a semiconductor memory device in accordance with a preferred embodiment of the present invention. Especially, FIG. 5A is a diagram showing only a trench structure shown in FIG. 4. FIG. 5B is an enlarged diagram of a marked region 'A' shown in FIG. 4. With reference to these drawings, detailed description on the storage node contact plug formation in the cell transistor region will be provided hereinafter.

Referring to FIG. 4; a gate oxide layer 302, a first gate conductive layer 303A, a second gate conductive layer 303B, and a nitride layer for use in a mask 304 are sequentially formed on a substrate 301. These sequentially formed layers are etched to form a plurality of gate structures G. A plurality of junction regions 305 are formed in predetermined portions of the substrate 301 disposed in lateral sides of the respective gate structures G. Herein, the junction region 305 which is contacted to a storage node contact plug, which will be subsequently formed, is called a storage node contact junction region.

Next, a gate light oxidation process is applied to sidewalls of the gate structures G after the above etching process for forming the gate structures G, and an oxide layer 306 serving as a buffer layer and a first spacer 307 are sequentially formed on the sidewalls of the gate structures G. Herein, the first spacer is made of a nitride-based material.

A first portion of the substrate 301 disposed in the storage node contact junction region 305 and exposed by the first spacer 307 is etched with a predetermined thickness, thereby forming a first shallow trench T1.

More importantly, a second spacer 309 is formed on the first spacer 307 in order to prevent dopants of the above mentioned storage node contact plug from diffusing out to the storage node contact junction region 305. That is, the second spacer 309 is a dopant diffusion barrier layer. At this time, the second spacer 309 extends from each sidewall of the gate structures G to each sidewall 310 of the first trench T1. Also, the second spacer 309 is made of a nitride-based material.

A second portion of the substrate 301 disposed in the storage node contact junction region 305 and exposed by the second spacer 309 is etched with a predetermined thickness, thereby forming a second trench T2. At this time, the depths of the first trench T1 and the second trench T2 are shallower than a depth of the storage node contact junction region 305.

Subsequent to the formation of a trench structure including the first trench T1 and the second trench T2, the above mentioned storage node contact plug 308 is formed into a space created at the trench structure and between the gate structures G. Herein, the storage node contact plug 308 is a doped polysilicon layer.

As shown in FIGS. 4, 5A and 5B, the preferred embodiment exemplifies the case that the first trench T1 is formed in the first portion of the substrate disposed in the storage node contact junction region 305 and exposed by the first spacer 307 and the second spacer 309 serving as a dopant diffusion barrier layer is formed such that the second spacer 309 extends from each sidewall of the gate structures G to each sidewall 310 of the first trench T1. As described above, the dopant diffusion barrier layer, i.e., the second spacer 309, serves a role in preventing dopants of the storage node contact plug 308 from diffusing towards the storage node contact junction region 305. That is, it is possible to prevent an incidence of highly concentrated electric potential at a certain region usually occurring when the storage node contact junction region 305 and the channel regions of the transistors meet by being closely neighbored with each other. Therefore, it is further possible to suppress an incidence of junction leakage currents and thus to prevent a refresh characteristic of a semiconductor memory device from being degraded.

Figure 6:
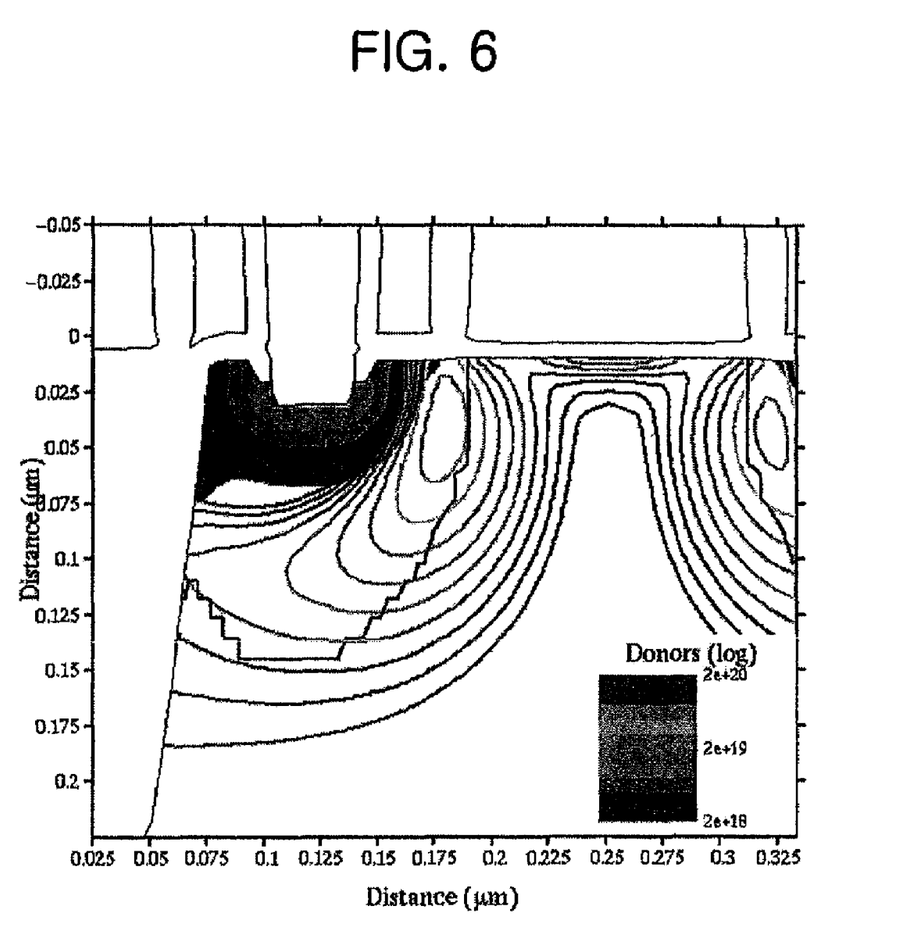
FIG. 6 shows a depth profile simulation result on a doping concentration in the semiconductor memory device fabricated in accordance with the preferred embodiment of the present invention.

FIG. 6 is a diagram showing a depth profile simulation result on a doping concentration in the semiconductor memory device shown in FIG. 4.

As shown, unlike the depth profile simulation result shown in FIG. 2, a doping concentration of a dopant, which is an N-type donor, changes gradually. As a result of this gradual change, it is possible to suppress an increase in junction leakage currents caused by the highly concentrated electric potential at a certain region.

Figure 7:
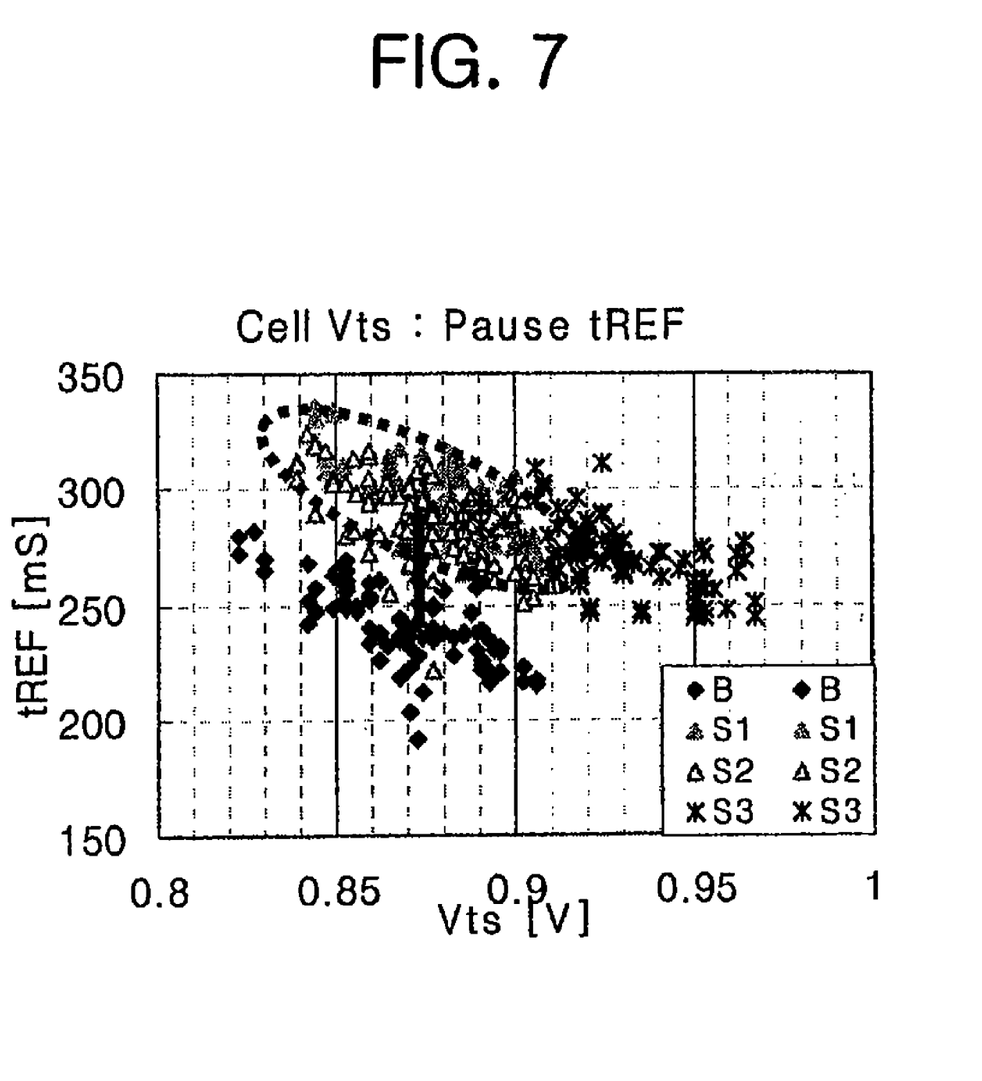
FIG. 7 is a graph showing a simulation result on comparative refresh time (tREF) measurements between the conventional semiconductor memory device and the semiconductor memory device fabricated according to the present invention.

FIG. 7 is a graph showing a simulation result on comparative refresh time (tREF) measurements between the conventional semiconductor memory device and the semiconductor memory device fabricated according to the present invention.

Compared with the conventional semiconductor memory device, there is an improvement on the refresh time (tREF) of approximately 60 ms in the semiconductor device fabricated in accordance with the present invention.

In accordance with the preferred embodiment of the present invention, there is provided another effect. In the conventional method, the first nitride layer 107A (refer to FIG. 1) is not etched during the anisotropic etching process. On the contrary, in accordance with the preferred embodiment of the present invention, the anisotropic etching process is performed to the first nitride layer for forming the first spacer 307, which is formed on the sidewalls of the gate structures by this anisotropic etching process. In the course of forming the first spacer 307 by the anisotropic etching process, the first portion of the substrate 301 is subjected to the over-etching process, thereby forming the first trench T1. Because of the anisotropic etching process and the over-etching process, the finally formed first spacer 307 has a thickness less than the originally formed thickness. That is, even if the first spacer 307 is thicker than the conventionally formed spacer, it is still possible to secure a sufficient storage node contact size and thus to prevent an incidence of void generation.

FIGS. 8A to 8E are cross-sectional views illustrating a method for fabricating a semiconductor memory device in accordance with the preferred embodiment of the present invention. Herein, the same reference numerals are used for the same constitution elements described in FIG. 4.

Figure 8A:
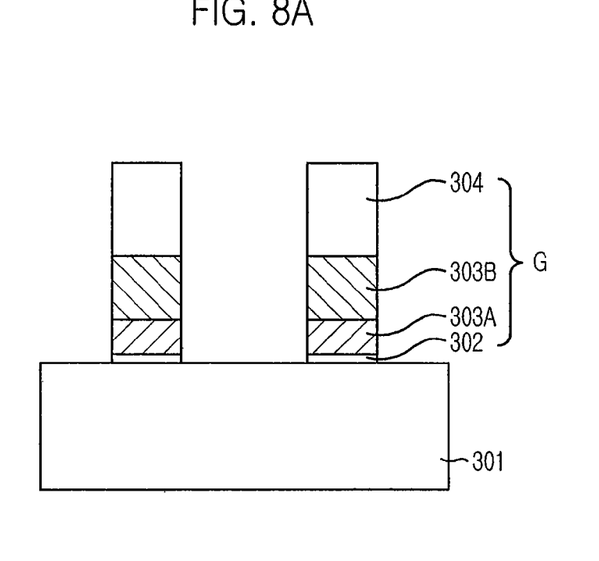
FIGS. 8A to 8E are cross-sectional views illustrating a method for fabricating a semiconductor memory device in accordance with the preferred embodiment of the present invention.

Referring to FIG. 8A, a gate oxide layer 302, a first gate conductive layer 303A, a second conductive layer 303B, and a nitride layer for use in a mask 304 are sequentially formed on a substrate 301 based on silicon. These sequentially formed layers are etched by using a gate mask, thereby forming a plurality of gate structures G.

More specific to the formation of the gate structures G, a photoresist layer is formed on the nitride layer 304 and is subjected to a photo-exposure process with use of the gate mask or a reticle. Then, a developing process is performed to form a photoresist pattern which is used as an etch mask during etching the nitride layer 304. Afterwards, the photoresist pattern is removed, and the first and the second gate conductive layers 303A and 303B are etched by using the patterned nitride layer 304 as an etch mask.

Instead of using the silicon substrate 301, it is possible to use other substrate types such as a substrate provided with a silicon epitaxial layer. Also, the gate oxide layer 302 can be made of a single material selected from silicon oxide, obtained through a thermal growth and/or deposition, and silicon oxynitride. Also, the gate oxide layer 302 can be formed in a single layer or multiple layers of the above listed materials. Furthermore, although this preferred embodiment exemplifies the case of stacking the first conductive layer 303A based on polysilicon and the second conductive layers 303B based on tungsten silicide, it is possible to have various stack structures obtained by stacking a metal layer, for instance, a tungsten layer, on a polysilicon layer. In addition, the nitride layer 304 is used as a gate mask insulation layer in this preferred embodiment of the present invention. However, it is still possible to use another type of an insulation layer instead of using nitride, and the gate mask insulation layer can be formed in a single layer or in multiple layers.

Figure 8B:
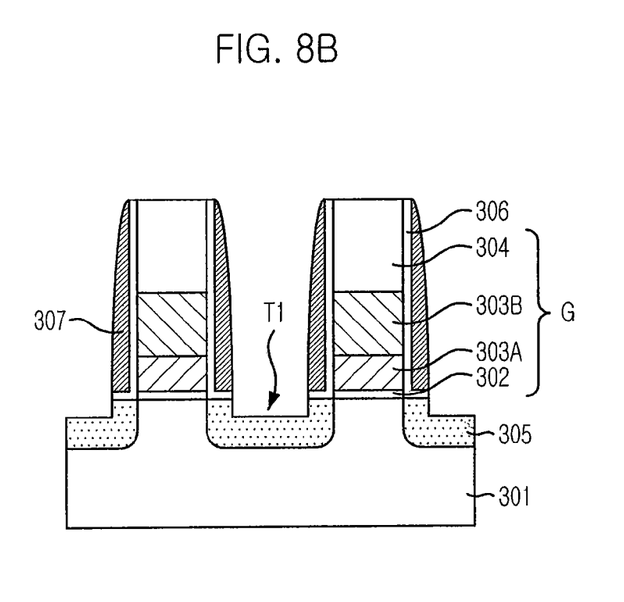

Referring to FIG. 8B, a gate light oxidation process is performed for the purpose of recovering damages created during the formation of the gate structures G and improving characteristics of the gate oxide layer 302. Then, a plurality of junction regions 305 are formed through employing an ion implantation process. Herein, the junction region 305 to which a storage node contact plug which will be subsequently formed is contacted is called a storage node contact junction region 305. An oxide layer 306 serving as a buffer layer is formed on the above resulting substrate structure.

Next, a first nitride layer for forming a gate spacer is formed on the oxide layer 306 and is then subjected to an anisotropic etching process to thereby form a first spacer 307 on sidewalls of the gate structures G. The anisotropic etching process is followed by an over-etching process in order for the oxide layer 306 and the first nitride layer for forming the first spacer 307 not to remain on a first portion of the substrate 301 disposed in the storage node contact junction region 305. From this over-etching process, the first portion of the substrate 301 disposed in the storage node contact junction region 305 is etched with a predetermined thickness, thereby obtaining a first trench T1.

Because of the anisotropic etching process for forming the first spacer 307 and the over-etching process, the first spacer 307 remaining on the sidewalls of the gate structures G has a thickness less than the originally deposited thickness. The first trench T1 has a thickness ranging from approximately 10 Å to approximately 100 Å. At this time, the thickness of the first trench T1 should not be deeper than that of the storage node contact junction region 305. Also, in addition to the use of nitride, other insulating materials can be used for forming the first spacer 307.

Figure 8C:
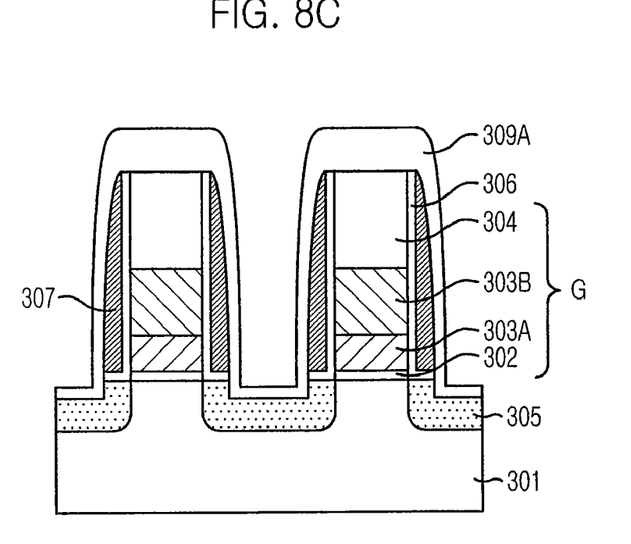

Referring to FIG. 8C, a second nitride layer 309A for forming a dopant diffusion barrier layer is formed with a predetermined thickness on the above resulting structure.

Figure 8D:
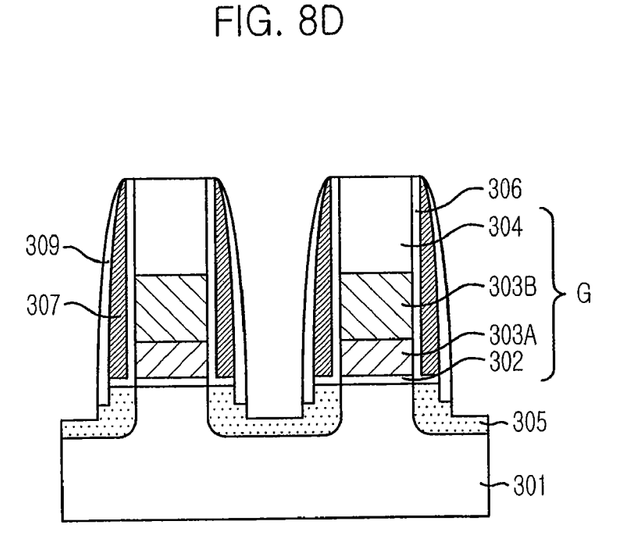

Referring to FIG. 8D, the second nitride layer 309A is subjected to an anisotropic etching process, thereby obtaining a second spacer 309 extending from the sidewalls of the gate structures G to sidewalls of the first trench T1. In the course of forming the second nitride layer 309A, a second trench T2 is formed by applying an over-etching process. It is also possible to omit this over-etching process for forming the second trench T2. However, it is more preferable to form the second trench T2 through performing the over-etching process which makes the second spacer 309 have a remaining thickness less than the originally deposited thickness so to widen a space between the gate structures G.

Figure 8E:
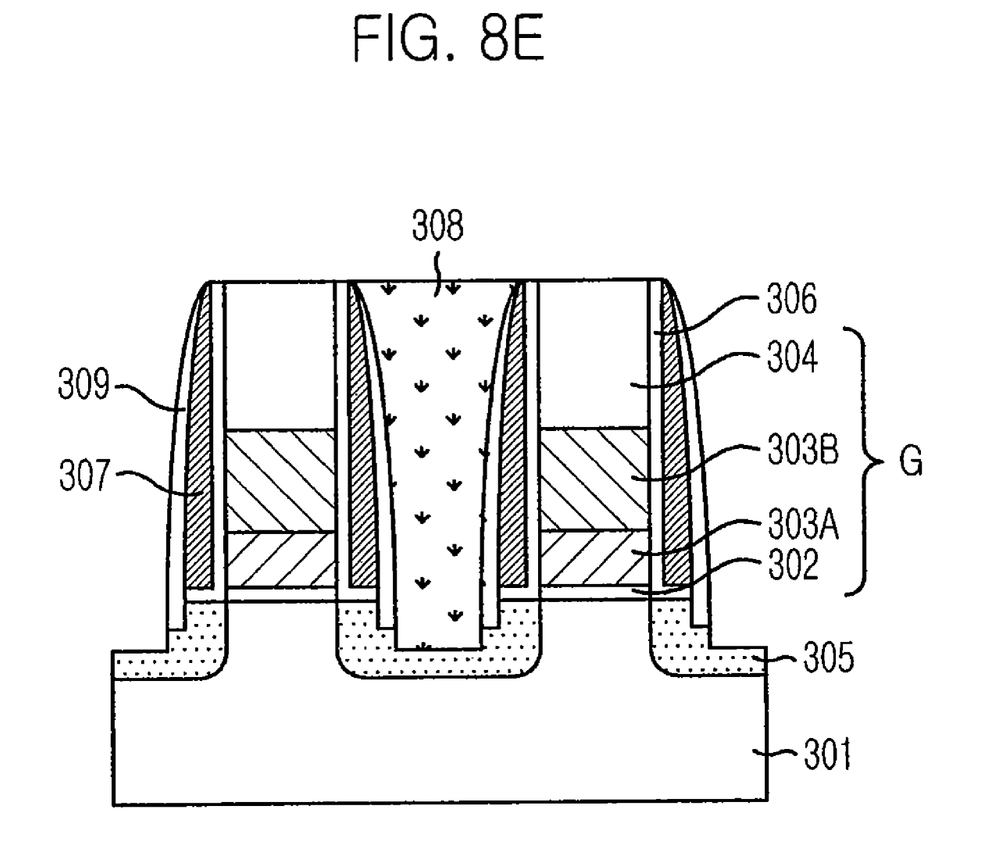

Referring to FIG. 8E, a conductive layer such as a doped polysilicon layer or an epitaxial silicon layer overlies the gate structures G. Then, the conductive layer is subjected to a polishing process or an etch-back process, thereby forming a contact plug 308. Herein, the contact plug 308 is a storage node contact plug.

In accordance with the present invention, the trench structure including the first trench and the second trench is formed in the predetermined portions of the substrate disposed in the storage node contact junction region, and a dopant diffusion barrier layer for preventing dopants from diffusing from the storage node contact plug to the storage node contact junction region is formed on the sidewalls of the first trench. As a result of the specific trench structure and the diffusion barrier layer, it is possible to prevent an incidence of degraded refresh characteristic caused by junction leakage currents.

Also, a space between the gate structures G is widened by applying the specific etching processes with respect to the nitride-based spacers formed on the sidewalls of the gate structures of the cell transistors. Accordingly, a margin for forming the storage node contact plug can be sufficiently secured. That is, the storage node contact plug can be formed without generating voids.

The present application contains subject matter related to the Korean patent application No. KR 2004-50199, filed in the Korean Patent Office on Jun. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

The invention claimed is:

1. A semiconductor memory device, comprising:
    a plurality of gate structures formed on a substrate, the plurality of gate structures including first and second gate structures that are provided adjacent to each other;
    a contact junction region formed in the substrate between the first and second gate structures;
    a trench formed by etching a portion of the substrate disposed in the contact junction region, the trench extending below an upper surface of the substrate;
    a dopant diffusion barrier layer formed on sidewalls of the trench and extending below the upper surface of the substrate; and
    a contact plug filled within a space defined between the first and second gate structures and within the trench, the contact plug contacting the contact junction region,
    wherein the dopant diffusion barrier layer prevents dopants within the contact plug from diffusing out.

2. The semiconductor memory device of claim 1, wherein the dopant diffusion barrier layer is formed as a spacer extending from an upper surface of the first gate structure to below the upper surface of the substrate.

3. The semiconductor memory device of claim 1 wherein the dopant diffusion barrier layer is made of a nitride-based material.

4. The semiconductor memory device of claim 2, wherein the spacer is made of a nitride-based material.

5. The semiconductor memory device in claim 1, wherein the contact junction region is a storage node contact junction region formed in the substrate, the substrate being a silicon substrate.

6. The semiconductor memory device of claim 1, wherein the trench has a depth shallower than that of the contact junction region and is offset from a sidewall of the first gate structure to define a step structure, the dopant diffusion barrier layer covering the step structure.

7. The semiconductor memory device of claim 2, wherein the trench does not extend below the contact junction region.

8. A semiconductor memory device, comprising:
    a plurality of gate structures formed on a substrate;
    a contact junction region formed in the substrate disposed in lateral sides of the respective gate structures;
    an insulating spacer formed on sidewalls of the gate structures;
    a first trench formed by etching a first portion of the substrate disposed in the contact junction region and exposed by the insulating spacer with a predetermined thickness, the first trench being offset from a sidewall of an adjacent gate structure and defining a first step structure;

a dopant diffusion barrier layer formed on sidewalls of the insulating spacer and sidewalls of the first trench, the dopant diffusion barrier layer covering the first step structure;

a second trench formed by etching a second portion of the substrate disposed in the contact junction region and exposed by the dopant diffusion barrier layer, the second trench being offset from a sidewall of the first trench and defining a second step structure; and a contact plug filled into a space created between the gate structures and within of the first trench and the second trench, the contact plug contacting the contact junction region, wherein the dopant diffusion barrier layer prevents dopants within the contact plug from diffusing out.

9. The semiconductor memory device of claim 8, wherein the insulating spacer is made of a first nitride-based material.

10. The semiconductor memory device of claim 8, wherein the dopant diffusion barrier layer is made of a second nitride-based material.

11. The semiconductor memory device of claim 8, further including an oxide layer between the insulating spacer and each of the gate structures.

12. The semiconductor memory device of claim 8, wherein each of the gate structures include a gate oxide layer, a gate conductive layer and an insulation layer for use in a mask.

13. The semiconductor memory device of claim 8, wherein the first trench and the second trench do not extend below the contact junction region.

14. The semiconductor memory device of claim 8, wherein the contact junction region is a storage node contact junction region.

15. The semiconductor memory device of claim 1, wherein the dopant diffusion barrier layer extends at least from an upper surface of the contact plug to below the upper surface of the substrate.

16. The semiconductor memory device of claim 8, wherein the dopant diffusion barrier layer extends substantially the entire length of a sidewall of the contact plug.

* * * * *